(12) United States Patent
Deriha et al.

(10) Patent No.: US 9,939,493 B2
(45) Date of Patent: Apr. 10, 2018

(54) APPARATUS FOR MONITORING VOLTAGE ACROSS ANY UNIT BATTERY IN BATTERY PACK

(71) Applicant: DENSO CORPORATION, Kariya, Aichi-pref. (JP)

(72) Inventors: Masashi Deriha, Kariya (JP); Tomomichi Mizoguchi, Inazawa (JP)

(73) Assignee: DENSO CORPORATION, Kariya (JP)

( * ) Notice: Subject to any disclaimer, the term of this patent is extended or adjusted under 35 U.S.C. 154(b) by 231 days.

(21) Appl. No.: 14/838,009

(22) Filed: Aug. 27, 2015

(65) Prior Publication Data

US 2016/0061903 A1     Mar. 3, 2016

(30) Foreign Application Priority Data

Aug. 27, 2014   (JP) ................. 2014-172647

(51) Int. Cl.
*H01M 10/46* (2006.01)
*G01R 31/36* (2006.01)

(52) U.S. Cl.
CPC ....... *G01R 31/362* (2013.01); *G01R 31/3658* (2013.01)

(58) Field of Classification Search
CPC ..... G01R 31/36; G01N 26/416; H02J 7/0013; H02J 7/0019; H02J 7/0026; H02J 7/0021; H02J 7/345
USPC ......... 320/116, 118, 119, 132, 149, DIG. 18, 320/DIG. 21; 324/426, 427, 433
See application file for complete search history.

(56) References Cited

U.S. PATENT DOCUMENTS

| 5,507,171 A | 4/1996 | Mattes et al. |
| 6,362,627 B1 * | 3/2002 | Shimamoto ............ G01R 19/25 324/434 |
| 2001/0038275 A1 * | 11/2001 | Hanada .................. H02J 7/345 320/118 |
| 2002/0075004 A1 | 6/2002 | Yudahira et al. |
| 2003/0052688 A1 | 3/2003 | Yudahira et al. |

FOREIGN PATENT DOCUMENTS

| JP | H05-197462 A | 8/1993 |
| JP | 2005-292137 A | 10/2015 |

* cited by examiner

*Primary Examiner* — Edward Tso
(74) *Attorney, Agent, or Firm* — Oliff PLC

(57) ABSTRACT

In an apparatus, an input switch circuit selectively connects one of unit batteries to a capacitor. A first group of at least one unit battery has a first polarity when being connected to the capacitor. A second group of at least one unit battery has a second polarity when being connected to the capacitor. A voltage converter converts a voltage of a unit battery selectively connected to the capacitor into a value within a voltage range manipulatable by a voltage monitor. A reference voltage setter variably sets a reference voltage according to one of the first polarity and the second polarity of the voltage of a unit battery selectively connected to the capacitor. The reference voltage is used as a reference to match a scale of the voltage of a unit cell selectively connected to the capacitor for each of the first and second polarities with the predetermined voltage range.

10 Claims, 5 Drawing Sheets

APPARATUS FOR MONITORING VOLTAGE ACROSS ANY UNIT BATTERY IN BATTERY PACK

CROSS REFERENCE TO RELATED APPLICATIONS

This application is based on and claims the benefit of priority from Japanese Patent Application 2014-172647 filed on Aug. 27, 2014, the disclosure of which is incorporated in its entirety herein by reference.

TECHNICAL FIELD

The present disclosure relates to apparatuses that use a capacitor to monitor a voltage across any unit battery in a battery pack comprised of a plurality of series-connected unit batteries.

BACKGROUND

A typical apparatus in these voltage monitoring apparatuses connects any unit battery in the battery pack to the capacitor, and charges the voltage across the selected unit battery into the capacitor. Thereafter, the apparatus connects the capacitor to a differential amplifier as an example of voltage converters, to cause the differential amplifier to amplify the difference in potential between both first and second ends of the capacitor. The differential amplifier outputs the amplified potential difference as an analog voltage to an analog-to-digital (A/D) converter, which is an example of voltage detectors. The A/D converter converts the analog voltage into a digital voltage as a measurement value of the selected unit battery in the battery pack.

In particular, the apparatus is configured to
(1) Connect the positive terminal of a first target unit battery in the battery pack to the first end of the capacitor while connecting the negative terminal of the target unit battery to the second end of the capacitor
(2) Connect the positive terminal of a second target unit battery adjacent to the first target unit battery in the battery pack to the second end of the capacitor while connecting the negative terminal of the unit battery to the first end of the capacitor.

That is, the polarity of the voltage across the first target unit battery applied to the capacitor is opposite to that of the voltage across the second target unit battery, which is adjacent to the first target unit battery, applied to the capacitor. The BACKGROUND describes the polarity of the voltage across the first target unit battery applied to the capacitor as a positive polarity, and the polarity of the voltage across the second target unit battery applied to the capacitor as a negative polarity. For example, for the battery pack comprised of first to n-th series-connected unit batteries, the apparatus can be configured to
(1) Connect each of odd-numbered unit batteries to the capacitor in the positive polarity
(2) Connect each of even-numbered unit batteries to the capacitor in the negative polarity.

The apparatus therefore requires the configuration that enables the A/D converter to convert each of the voltage across the capacitor in the positive polarity and the voltage across the capacitor in the negative polarity into a digital voltage.

Japanese Patent Application Publication No. 2005-292137 discloses such an apparatus in order to address such a requirement.

The published apparatus is designed in consideration of the voltage range, such as the voltage range from 0 to 5 V, which the A/D converter can handle, i.e. manipulate. Specifically, the published apparatus provides, to the differential amplifier, a reference voltage intermediate between the lower and upper limits of the voltage range, i.e. 2.5 V between 0 V and 5 V.

This configuration of the published apparatus converts a voltage across the capacitor having the positive polarity into a digital voltage within the first voltage range from the reference voltage to the upper limit, i.e. the first voltage range from 2.5 to 5 V. This configuration also converts a voltage across the capacitor having the negative polarity into a digital voltage within the second voltage range from the lower limit to the reference voltage, i.e. the second voltage range from 0 to 2.5 V.

This configuration therefore enables the A/D converter to convert each of a voltage across the capacitor in the positive polarity and a voltage across the capacitor in the negative polarity into a digital voltage.

SUMMARY

Unfortunately, the published apparatus uses a fixed voltage, i.e. 2.5 V, as the reference voltage, resulting in difficulty measuring the voltage across any unit battery in the full scale of the voltage range manipulatable by the A/D converter. This may impose limitation on the accuracy of measuring a voltage across any unit battery in the battery pack.

In view of the circumstances set forth above, one aspect of the present disclosure seeks to provide apparatuses for monitoring a voltage across any unit battery in a battery pack comprised of a plurality of series-connected unit batteries using a capacitor, each of which is capable of addressing the problem set forth above.

Specifically, an alternative aspect of the present disclosure aims to provide such apparatuses, each of which is capable of improving the accuracy of measuring a voltage across any unit battery in the battery pack.

According to an exemplary aspect of the present disclosure, there is provided an apparatus including a voltage detector for monitoring a voltage across a selected unit battery in a battery pack comprising a plurality of unit batteries. The apparatus includes a capacitor connected to the plurality of unit batteries via respective connection lines. The apparatus includes an input switch circuit configured to selectively connect one of the unit batteries to the capacitor. A first group of at least one unit battery included in the unit batteries has a first polarity when being connected to the capacitor, and a second group of at least one unit battery included in the unit batteries has a second polarity when being connected to the capacitor. The second polarity is opposite to the first polarity. The apparatus includes a voltage converter configured to convert a voltage of a unit battery selectively connected to the capacitor into a value within a predetermined voltage range manipulatable by the voltage detector. The apparatus includes a reference voltage setter configured to variably set a reference voltage according to one of the first polarity and the second polarity of the voltage of a unit battery selectively connected to the capacitor. The reference voltage is used as a reference to match a scale of the voltage of a unit cell selectively connected to the capacitor with the predetermined voltage range.

The reference voltage setter variably sets the reference voltage according to one of the first polarity and the second polarity of the voltage of a unit battery selectively connected to the capacitor. The reference voltage is used as a reference to match the scale of the voltage of a unit cell selectively connected to the capacitor with the predetermined voltage range.

This reliably converts the voltage of a unit battery selectively connected to the capacitor into a value within the predetermined voltage range manipulatable by the voltage detector whichever of the first polarity and the second polarity is set to a unit battery selectively connected to the capacitor.

Various aspects of the present disclosure can include and/or exclude different features, and/or advantages where applicable. In addition, various aspects of the present disclosure can combine one or more feature of other embodiments where applicable. The descriptions of features, and/or advantages of particular embodiments should not be construed as limiting other embodiments or the claims.

BRIEF DESCRIPTION OF THE DRAWINGS

Other aspects of the present disclosure will become apparent from the following description of embodiments with reference to the accompanying drawings in which.

DETAILED DESCRIPTION OF EMBODIMENT

Figure 1:
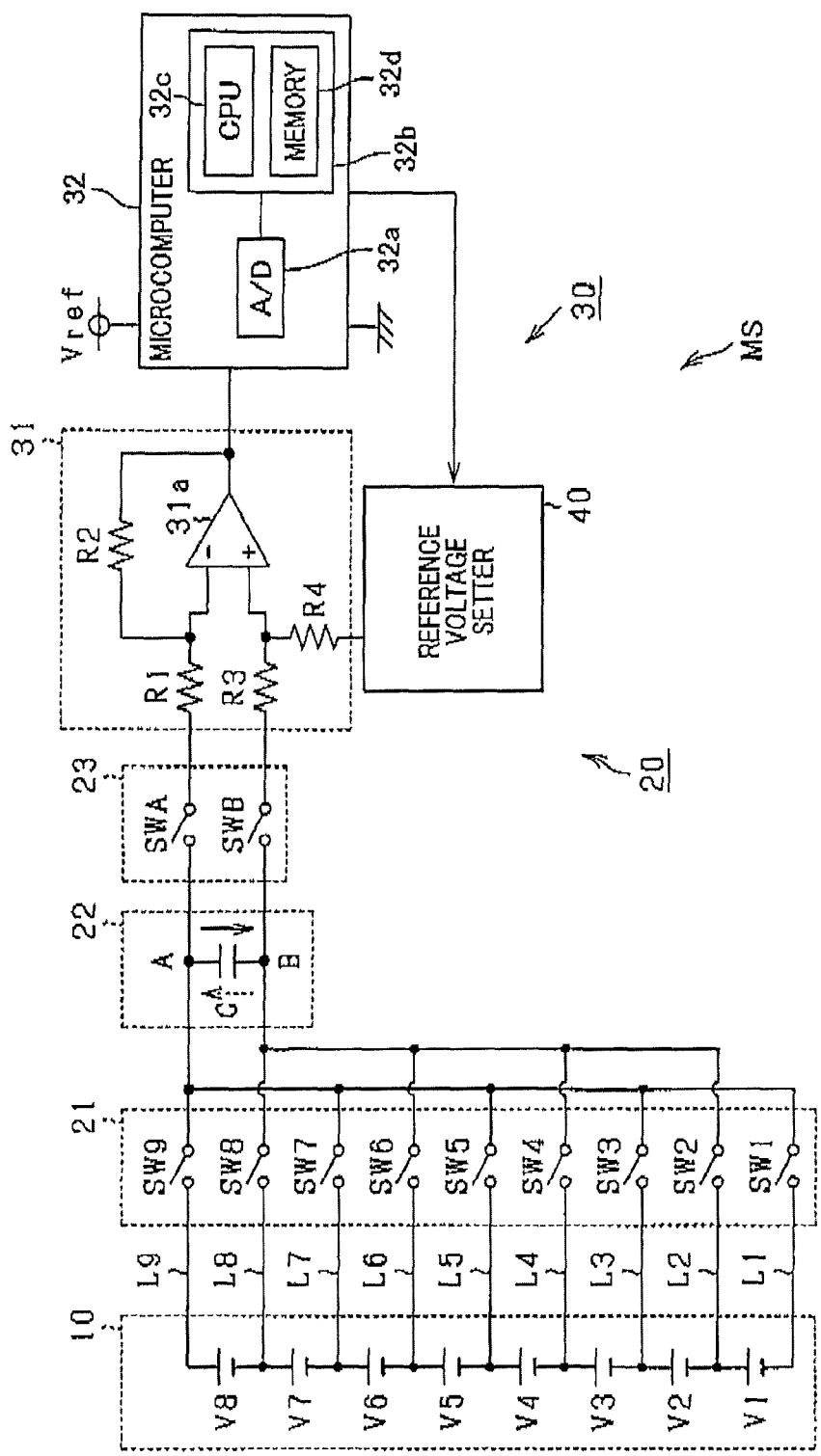
FIG. 1 is a circuit diagram schematically illustrating an example of the configuration of a battery monitoring system according to the first embodiment of the present disclosure.

The following describes embodiments of the present disclosure with reference to the accompanying drawings. In the drawings, identical reference characters are utilized to identify identical corresponding components.

First Embodiment

The following describes a voltage monitoring system MS for monitoring a battery pack 10 serving as a high-voltage battery installed in a vehicle. To the voltage monitoring system MS, an apparatus 20 for monitoring a voltage across any unit battery in the battery pack 10 is applied. The apparatus 20, referred to as a voltage monitoring apparatus 20, is designed as a flying-capacitor monitoring apparatus.

Referring to FIG. 1, the voltage monitoring system MS includes the battery pack 10 and the voltage monitoring apparatus 20.

The battery pack 10 serves as a power source for supplying power to a motor for running the vehicle via, for example, an inverter. The battery pack 10 includes a plurality of, for example, eight unit batteries, V1 to V8 connected in series. Each of the unit batteries V1 to V8 can be comprised of, for example, a cell, i.e. a unit cell, which is a minimum unit capable of charge and discharge. Each of the unit batteries V1 to V8 can be comprised of, for example, a series connection member made up with a plurality of such cells connected in series. A chargeable lithium-ion secondary battery cell or a lead battery cell can be used as each cell of the battery pack 10.

For example, each of the unit batteries V1 to V8 has a predetermined voltage range from 0 to 30 V.

The voltage monitoring apparatus 20 is connected to the battery pack 10 via monitor lines L1 to L9. The monitor line L1 has a first end connected to the negative end of the unit battery V1, and the monitor line L9 has a first end connected to the positive end of the unit battery V8. Each of the monitor lines Lk (k=2 to 8) has a first end connected to a connection point between the positive end of the unit battery V(k−1) and the negative end of the unit battery Vk.

The voltage monitoring apparatus 20 includes an input switch circuit 21, a capacitor circuit 22, an output switch circuit 23, and a voltage detector 30.

The input switch circuit 21 includes switches SW1 to SW9 whose number matches with the number of monitor lines L1 to L9. Specifically, each of the monitor lines L1 to L9 has a second end opposite to the first end, and each of the switches SW1 to SW9 has a first end and a second end opposite to the first end. The second end of each of the monitor lines L1 to L9 is individually connected to the first end of a corresponding one of the switches SW1 to SW9.

The capacitor circuit 22 includes a capacitor C, and first and second connection terminals A and B provided respectively to both ends of the capacitor C. The first connection terminal A is commonly connected to the second ends of odd-numbered switches SWi (i=1, 3, 5, 7, 9); the odd-numbered switches SW1, SW3, SW5, SW7, and SW9 are referred to as first-group switches hereinafter. The second connection terminal B is commonly connected to the second ends of even-numbered switches SWj (j=2, 4, 6, 8); the even-numbered switches SW2, SW4, SW6, and SW8 are referred to as second-group switches hereinafter.

The output switch circuit 23 includes a pair of switches SWA and SWB. The switch SWA has a first end and a second end opposite to the first end. The first end of the switch SWA is connected to the first connection terminal A of the capacitor circuit 22. The switch SWB has a first end and a second end opposite to the first end. The first end of the switch SWB is connected to the second connection terminal B of the capacitor circuit 22.

The voltage detector 30 includes a differential amplifier 31, a microcomputer 32, and a reference voltage setter 40. The microcomputer 32 operates based on an input voltage Vref supplied from, for example, a power source installed in the vehicle.

The differential amplifier 31 includes an operational amplifier 31a, and first to fourth resistors R1 to R4. The operational amplifier 31a has a non-inverting input terminal, an inverting input terminal, and an output terminal.

The first resistor R1 is connected between the second end of the switch SWA and the inverting input terminal of the operational amplifier 31a. That is, the first resistor R1 is connected between the inverting input terminal of the operational amplifier 31a and each of the first-group switches SWi of the input switch circuit 21 via the switch SWA of the output switch circuit 23.

The second resistor R2 is connected between the inverting input terminal and the output terminal of the operational amplifier 31a.

The third resistor R3 is connected between the second end of the switch SWB and the non-inverting input terminal of the operational amplifier 31a. That is, the third resistor R3 is connected between the non-inverting input terminal of the operational amplifier 31a and each of the second-group switches SWj of the input switch circuit 21 via the switch SWB of the output switch circuit 23.

The fourth resistor R4 has a first end connected to the non-inverting input terminal of the operational amplifier 31a, and has a second end connected to the reference voltage setter 40.

The reference voltage setter 40 changes a reference voltage, i.e. an offset voltage, to be applied to the non-inverting input terminal of the operational amplifier 31a of the differential amplifier 31 according to the polarity of the voltage across the capacitor C under control of the microcomputer 32. Note that the first embodiment defines, for example, the positive polarity of the voltage across the capacitor C when the potential at the first connection terminal A is positive, and the negative polarity of the voltage across the capacitor C when the potential at the second connection terminal B is negative.

Figure 2:
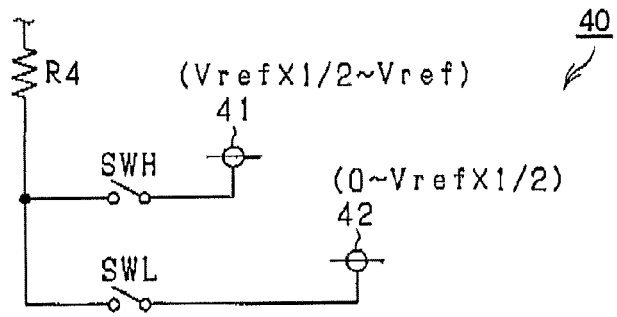
FIG. 2 is a circuit diagram schematically illustrating an example of the configuration of a reference voltage setter illustrated in FIG. 1.

FIG. 2 schematically illustrates an example of the circuit diagram of the reference voltage setter 40. The reference voltage setter 40 includes a first voltage path and a second voltage path. The first voltage path includes a first power source 41 and a switch SWH, and the second voltage path includes a second power source 42 and a switch SWL. The switch SWH is connected between the first power source 41 and the second end of the fourth resistor R4, and the switch SWL is connected between the second power source 42 and the second end of the fourth resistor R4.

Note that all switches SW1 to SW9, SWA, SWB, SWH, and SWL are controllably connected to the microcomputer 32, i.e. its CPU 32c. That is, the CPU 32c is capable of controlling individually on/off state of each of the switches SW1 to SW9, SWA, SWB, SWH, and SWL.

The first power source 41 is designed to output a voltage, which is within the first range from the half of the input voltage Vref to the input voltage Vref. The second power source 42 is designed to output a voltage, which is within the second range from zero to the half of the input voltage Vref. That is, the voltage output from the first power source 41 is set to be higher than the voltage output from the second power source 42.

The switches SWH and SWL are connected to the microcomputer 32. As described in detail later, the microcomputer 32 individually sends instructions to the each of the switches SWA and SWB to alternately turn on a corresponding one of the switches SWA and SWB while preventing simultaneous-on of both switches SWA and SWB. The on-off control of each of the switches SWH and SWL under control of the microcomputer 32 causes one of the first and second power sources 41 and 42 to be selectively connected to the fourth resistor R4. This switches the reference voltage to be applied to the non-inverting input terminal of the operational amplifier 31a between the output voltage from the first power source 41 and the output voltage from the second power source 42.

For example, the microcomputer 32 switches on the switch SWL while switching off the switch SWH upon the polarity of the voltage across the capacitor C being positive. This applies, to the non-inverting input terminal of the operational amplifier 31a, the reference voltage within the second range from zero inclusive to the half of the input voltage Vref exclusive.

In contrast, the microcomputer 32 switches on the switch SHL while switching off the switch SWL upon the polarity of the voltage across the capacitor C being negative. This applies, to the non-inverting input terminal of the operational amplifier 31a, the reference voltage within the first range from the half of the input voltage Vref to the input voltage Vref inclusive.

Referring to FIG. 1, the microcomputer 32 serves as, for example, a voltage measurement unit. The first embodiment uses, as the microcomputer 32, a single-chip, i.e. a one-chip, microcomputer incorporating therein an A/D converter 32a. The microcomputer 32 and the A/D converter 32a can be separately provided in the voltage detector 30 while they are electrically communicable with each other.

For example, the microcomputer 32 includes a computer circuit 32b essentially including a CPU 32c, a memory 32d including a ROM and a RAM, and input/output units; the computer circuit 32b is communicably connected to the A/D converter 32a. At least the A/D converter 32a and the computer circuit 32b serve as a voltage monitor. The microcomputer 32 operates based on the input voltage Vref set forth above. The first embodiment sets the input voltage, i.e. the operating voltage, Vref to 5 V, but can set it to another voltage, such as 3.3 V. Programs stored in, for example, the ROM cause the CPU 32c to carry out various tasks.

The A/D converter 32a converts an output voltage signal from the differential amplifier 31 into digital voltage values. Specifically, the A/D converter 32a converts the output voltage signal from the differential amplifier 31 within the range from 0 to the Vref corresponding to 5 V into digital voltage values with a resolution of 10 bits corresponding to the manipulated full scale of the microcomputer 32. The voltage range from 0 to 5 V represents a range manipulatable by the microcomputer 32, i.e. represents a full scale of the microcomputer 32.

For example, the first embodiment previously sets the reference voltage being applied to the non-inverting input terminal of the operational amplifier 31a to 0 V upon the positive polarity of the voltage across the capacitor C occurring. In addition, the first embodiment previously sets the reference voltage being applied to the non-inverting input terminal of the operational amplifier 31a to 5 V upon the polarity of the voltage across the capacitor C being negative.

Adjusting resistances of the respective resistors R1 to R4 of the differential amplifier 31 and a value of the reference voltage enables the voltage across the capacitor C to be converted into a voltage within the voltage range from 0 to 5 V manipulatable by the microcomputer 32.

For example, the differential amplifier 31 converts the voltage across the capacitor C, whose range from 0 to 30, into a voltage within the voltage range from the reference voltage of 0 to 5 V, which corresponds to the manipulated full scale of the microcomputer 32, upon the positive polarity of the voltage across the capacitor C occurring.

In addition, the differential amplifier 31 converts the voltage across the capacitor C, whose range is from −30 to 0 V, into a voltage within the voltage range from −5 to 0 V, which corresponds to the manipulated full scale of the microcomputer 32, upon the polarity of the voltage across the capacitor C being negative.

Specifically, the voltage detector 30 switches the reference voltage applied to the differential amplifier 31 between 0 V and 5 V according to the polarity of the voltage across the capacitor C. This switching enables the voltage across the capacitor C, which represents a voltage across any unit battery, to be converted into a digital signal based on the resolution of 10 bits corresponding to the manipulatable full scale of the microcomputer 32.

That is, the reference voltage is used as a reference to match the scale of the voltage of a unit cell selectively connected to the capacitor C for each of the positive and negative polarities with the voltage range from 0 to 5 V manipulatable by the microcomputer 32.

The CPU 32c switchably outputs instructions to the input switch circuit 21 and the output switch circuit 23 upon measurement of any unit battery in the unit batteries V1 to V8. Each of the instructions represents open, i.e. turn-off, or close, i.e. turn-on, for the corresponding switch.

The CPU 32c also outputs individual instructions to the respective switches SWL and SWH according to the polarity of the voltage across the capacitor C upon monitoring of any unit battery in the unit batteries V1 to V8. In detail, the CPU 32c outputs the turn-on instruction to the switch SWL to turn it on and the turn-off instruction to the switch SWH to turn it off upon the positive polarity of the voltage across the capacitor C occurring. This applies the reference voltage of 0 V to the non-inverting input terminal of the operational amplifier 31a.

Additionally, the CPU 32c outputs the turn-on instruction to the switch SWH to turn it on and the turn-off instruction to the switch SWL to turn it off upon the negative polarity of the voltage across the capacitor C occurring. This applies the reference voltage of 5 V to the non-inverting input terminal of the operational amplifier 31a.

The CPU 32c is capable of identifying whether the voltage across the capacitor C has the positive polarity or the negative polarity according to which of the unit batteries V1 to V8 has charged the capacitor C. Specifically, the CPU 32c is capable of identifying which of the unit batteries V1 to V8 is selected to charge the capacitor C according to the instructions sent to selected switches in the switches SW1 to SW9. Specifically, the CPU 32c identifies the voltage across the capacitor C has the positive polarity when selecting an even-numbered unit battery Vm (m=2, 4, 6, or 8) according to the instructions sent to the input switch circuit 21. In addition, the CPU 32c identifies the voltage across the capacitor C has the negative polarity when selecting an odd-numbered unit battery Vn (n=1, 3, 5, 7, or 9) according to the instructions sent to the input switch circuit 21.

Let us consider a comparative example of a voltage monitoring system in which the reference voltage applied to the operational amplifier of the differential amplifier is a fixed value. The differential amplifier of the comparative example is configured to receive the voltage across the capacitor within the range from −30 to +30 V. The voltage range is the sum of the voltage range from 0 to 30 V for the positive polarity of the voltage across the capacitor and the voltage range from −30 to 0 V for the negative polarity of the voltage across the capacitor. Then, the differential amplifier is configured to convert the voltage range from −30 to 30 V into a predetermined voltage range from 0 to 5 V, which is manipulatable by the microcomputer.

For example, let us consider a case where the reference voltage is fixedly set to the intermediate value of 2.5 V in the manipulated voltage range from 0 to 5 V of the microcomputer.

In this case, the differential amplifier converts the voltage across the capacitor, whose range is from 0 to 30 V, into the voltage range from 2.5 to 5 V during the positive polarity of the voltage across the capacitor. In addition, the differential amplifier converts the voltage across the capacitor, whose range from −30 to 0 V, into the voltage range from 0 to 2.5 V during the negative polarity of the voltage across the capacitor.

Thus, during the positive polarity of the voltage across the capacitor, this case uses only a limited range from 2.5 to 5 V of the manipulated full scale of the microcomputer, and therefore cannot use the remaining range from 0 to 2.5 V. Similarly, during the negative polarity of the voltage across the capacitor, this case uses only a limited range from 0 to 2.5 V of the manipulated full scale of the microcomputer, and therefore cannot use the remaining range from 2.5 to 5.

In contrast, the voltage detector 30 switches the reference voltage applied to the differential amplifier 31 between 0 V and 5 V according to the polarity of the voltage across the capacitor C.

Specifically, the voltage detector 30 switches the reference voltage applied to the differential amplifier 31 to 0 V during the positive polarity of the voltage across the capacitor C. This enables the differential amplifier 31 to convert the voltage across the capacitor C, whose range from 0 to 30 V, into a voltage expressed based on the voltage range from the reference voltage of 0 to 5 V, which corresponds to the manipulated full scale of the microcomputer 32.

Additionally, the voltage detector 30 switches the reference voltage applied to the differential amplifier 31 to 5 V during the negative polarity of the voltage across the capacitor C. This enables the differential amplifier 31 to convert the voltage across the capacitor C, whose range from −30 to 0 V, into the voltage range from the reference voltage of −5 to 0 V, which corresponds to the manipulated full scale of the microcomputer 32.

The above voltage detector 30 is configured to monitor the voltage across any unit battery based on the manipulated full scale of the microcomputer 32 according to the corresponding polarity of the voltage across the capacitor C. This configuration improves the accuracy of monitoring the voltage across any unit battery in the battery pack 10.

Figure 3:
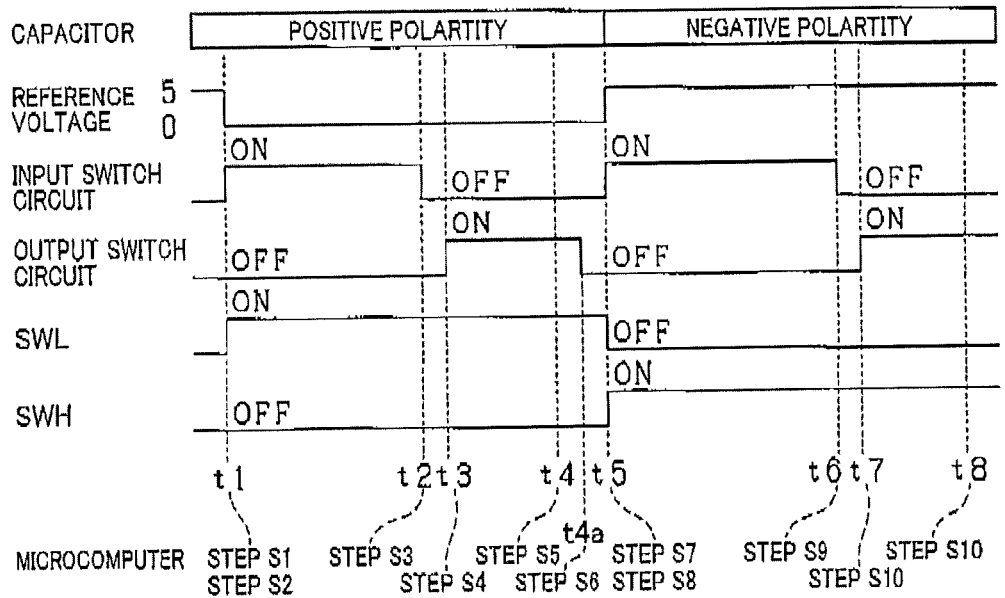
FIG. 3 is a timing chart schematically illustrating operations of a battery monitoring apparatus of the battery monitoring system illustrated in FIG. 1.

Next, the following describes operations of the above configured voltage detector 30 for measuring voltages of selected unit batteries in the unit batteries V1 to V8 with reference to FIG. 3, which is a timing chart illustrating the operations of the voltage detector 30.

At time t1, the CPU 32c instructs the switches SW2 and SW3 of the input switch circuit 21 to turn them on, and instructs the switches SWA and SWB to turn them off in step S1. This causes the voltage across the unit battery V2 to charge the capacitor C, so that a voltage is charged in the capacitor C while the potential at the first connection terminal A is higher than the potential at the second connection terminal B (see the solid arrow in the block 22). This results in the voltage charged in the capacitor C having the positive polarity.

At the time t1, the CPU 32c also instructs the switch SWL of the reference voltage setter 40 to turn it on while keeping the switch SWH off. This applies the reference voltage of 0 V to the non-inverting input terminal of the operational amplifier 31a of the differential amplifier 31 in step S2. The CPU 32c of the first embodiment switches the switch SWL to the on state at the time t1, but can switch the switch SWL to the on state before turn-on of the switches SWA and SWB of the output switch circuit 23.

After a predetermined time has elapsed since the time t1, the CPU 32c turns off the switches SW2 and SW3 at time t2 in step S3. After a predetermined short time has elapsed since the time t2, the CPU 32c instructs the switches SWA and SWB to turn them on at time t3 in step S4. This causes the voltage across the capacitor C to input to the differential amplifier 31, so that the input voltage within the range from 0 to 30 V is converted into a voltage within the manipulated voltage range from 0 to 5 V.

When a predetermined A/D conversion timing t4 comes after a predetermined time has elapsed since the time t3, the A/D converter 32a converts the voltage converted by the differential amplifier 31 into a digital voltage value, and outputs the digital voltage value to the CPU 32c in step S5. The CPU 32c stores the digital voltage value in the memory 32d as a voltage value across the unit battery V2 at the time t4 in step S5.

Figure 4:
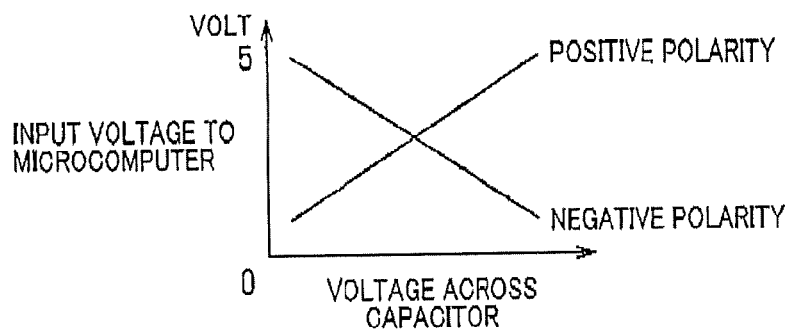
FIG. 4 is a graph schematically illustrating an example of a relationship between an input voltage to a microcomputer and a voltage across a capacitor illustrated in FIG. 1.

In particular, the differential amplifier 31 converts the voltage across the capacitor C with the positive polarity, which is within the range from 0 to 30 V, into a voltage matching the manipulated full scale, i.e. the range from 0 to 5 V, of the microcomputer 32 (see FIG. 4). This enables the voltage converted by the differential amplifier 31 to be converted into a digital voltage value with a resolution of 10 bits corresponding to the manipulated full scale of the microcomputer 32. This therefore improves the accuracy, i.e. the resolution, of monitoring the voltage across the selected unit battery V2 in the battery pack 10.

After the time t4, the CPU 32c instructs the switches SWA and SWB to turn them off at time t4a in step S6.

After a predetermined monitoring cycle has elapsed since the time t1 after the time t4a, the CPU 32c instructs the switches SW3 and SW4 of the input switch circuit 21 to turn them on at time t5 in step S7. This causes the voltage across the unit battery V3 to charge the capacitor C, so that a voltage is charged in the capacitor C while the potential at the second connection terminal B is higher than the potential at the first connection terminal A (see the dashed arrow in the block 22). This results in the voltage charged in the capacitor C having the negative polarity.

At the time t5, the CPU 32c also instructs the switch SWL of the reference voltage setter 40 to turn it off, and the CPU 32c instructs the switch SWH to turn it on at the timing when an unillustrated dead time has elapsed since the time t5 in step S8. This applies the reference voltage of 5 V to the non-inverting input terminal of the operational amplifier 31a of the differential amplifier 31.

After a predetermined time has elapsed since the time t5, the CPU 32c turns off the switches SW3 and SW4 at time t6 in step S9. After a predetermined short time has elapsed since the time t6, the CPU 32c instructs the switches SWA and SWB to turn them on at time t7 in step S10. This causes the voltage across the capacitor C to input to the differential amplifier 31, so that the input voltage within the range from −30 to 0 V is converted into a voltage within the manipulated voltage range from −5 to 0 V.

When a predetermined A/D conversion timing t8 comes after a predetermined time has elapsed since the time t7, the A/D converter 32a converts the voltage converted by the differential amplifier 31 into a digital voltage value, and outputs the digital voltage value to the CPU 32c in step S10. The CPU 32c stores the digital voltage value in the memory 32d as a voltage value across the unit battery V3 in step S10.

In particular, the differential amplifier 31 converts the voltage across the capacitor C with the negative polarity, which is within the range from −30 to 0 V, into a voltage matching the manipulated full scale, i.e. the range from −5 to 0 V, of the microcomputer 32. This enables the voltage converted by the differential amplifier 31 to be converted into a digital voltage value with a resolution of 10 bits corresponding to the manipulated full scale of the microcomputer 32. This therefore improves the accuracy, i.e. the resolution, of monitoring the voltage across the selected unit battery V2 in the battery pack 10.

The above configured voltage monitoring apparatus 20 achieves the following advantages.

As described above, the differential amplifier of the comparative example is configured to receive the voltage range across the capacitor within the range from, for example, −30 to +30 V. The voltage range is the sum of the voltage range from, for example, 0 to 30 V for the positive polarity of the voltage across the capacitor and the voltage range from, for example, −30 to 0 V for the negative polarity of the voltage across the capacitor. Then, the differential amplifier is configured to convert the voltage range from, for example, −30 to +30 V into a predetermined voltage range from, for example, 0 to 5 V, which is manipulatable by the microcomputer.

Unfortunately, the differential amplifier of the comparative example uses only a limited range in the manipulated full scale of the microcomputer for each of the positive and negative polarities of the voltage across the capacitor. This results in the accuracy, i.e. the resolution, of monitoring the voltage across any unit battery in the battery pack 10 being restricted.

In contrast, the voltage monitoring apparatus 20 sets the reference voltage, on which the differential amplifier 31 converts the voltage across the capacitor C, to be variable according to the polarity of the voltage across the capacitor C. This configuration causes the differential amplifier 31 to convert the voltage across the capacitor C into a voltage matching with the manipulated voltage range of the microcomputer 32 according to the polarity of the voltage across the capacitor C.

For example, the differential amplifier 31 converts the voltage across the capacitor C, whose range from, for example, 0 to 30 V during the positive polarity of the voltage across the capacitor C, into a voltage within the range from the reference voltage of 0 to 5 V, which corresponds to the manipulated full scale of the microcomputer 32. In addition, the differential amplifier 31 converts the voltage across the capacitor C, whose range from, for example, −30 to 0 V during the negative polarity of the voltage across the capacitor C, into a voltage within the range from the reference voltage of −5 to 0 V, which corresponds to the manipulated full scale of the microcomputer 32.

This therefore improves the accuracy of monitoring the voltage across any unit battery in the battery pack 10.

If the reference voltage was set according to the polarity of the voltage across the capacitor C after the output switch circuit 23 connects between the capacitor C and the microcomputer 32, the level of the digital voltage converted by the A/D converter 32a might exceed the upper limit of the manipulated voltage range of the microcomputer 32.

In contrast, the voltage monitoring apparatus 20 is configured to set the reference voltage according to the polarity of the voltage across the capacitor C, and thereafter, causes the output switch circuit 23 to connect between the capacitor C and the microcomputer 32.

This configuration carries out conversion of the voltage across the capacitor C based on the reference voltage without the level of the digital voltage converted by the A/D converter 32a exceeding the upper limit of the manipulated voltage range of the microcomputer 32.

Additionally, the voltage monitoring apparatus 20 is provided with the first voltage path including the first power source 41 and the switch SWH connecting between the differential amplifier 31 and the first power source 41. The voltage monitoring apparatus 20 is also provided with the second voltage path including the second power source 42 and the switch SWL connecting between the differential amplifier 31 and the second power source 42.

The voltage monitoring apparatus 20 is configured to selectively turn on one of the switch SWH and the switch SWL according to the polarity of the voltage across the capacitor C, thus changing the reference voltage according to the polarity of the voltage across the capacitor C. This configuration therefore reliably and easily changes the reference voltage according to the polarity of the voltage across the capacitor C.

Second Embodiment

Figure 5:
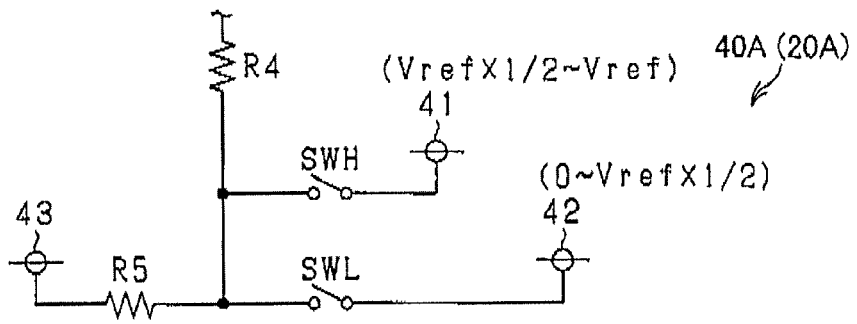
FIG. 5 is a circuit diagram schematically illustrating an example of the configuration of a reference voltage setter according to the second embodiment of the present disclosure.

The following describes a battery monitoring apparatus 20A according to the second embodiment of the present disclosure with reference to FIG. 5 while focusing on the different points between the second embodiment and the first embodiment.

The battery monitoring apparatus 20 of the first embodiment turns off the switch SWL at the time t5, and turns on the switch SWH at the timing when the unillustrated dead time has elapsed since the time t5. That is, if the switches SWH and SWL were simultaneously turned on, an unintentional current could flow into the differential amplifier 31, resulting in any deterioration to the differential amplifier 31.

During the dead time, both the switches SWH and SWL are off. This may result in the reference voltage applied to the operational amplifier 31a being unstable. Thus, there is a requirement to resolve such instability of the reference voltage in the battery monitoring apparatus 20 of the first embodiment.

In view of these circumstances, a reference voltage setter 40A of the battery monitoring apparatus 20A according to the second embodiment further includes a third power source 43 and a resistor R5 in addition to the structure of the reference voltage setter 40. The third power source 43 is connected to the second end of the resistor R4 via the resistor R5. For example, the third power source 43 outputs a voltage identical to the voltage output from the first power source 41 or the second power source 42.

The above configured reference voltage setter 40A enables the output voltage of the third power source 43 to be input to the non-inverting input terminal of the operational amplifier 31a during the dead time for which both the switches SWH and SWL are off. This therefore makes the reference voltage applied to the operational amplifier 31a stable during the dead time, thus satisfying such a requirement to resolve such instability of the reference voltage in the battery monitoring apparatus 20 of the first embodiment.

Third Embodiment

Figure 6A:
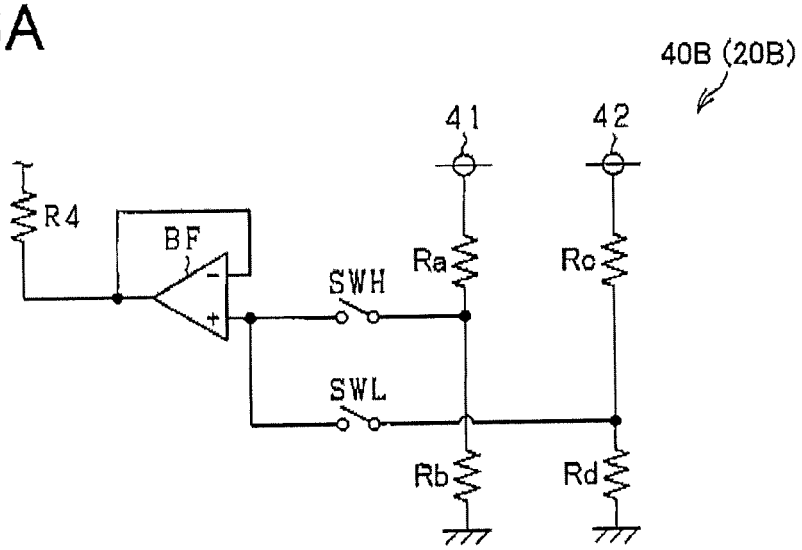
FIG. 6A is a circuit diagram schematically illustrating an example of the configuration of a reference voltage setter according to the third embodiment of the present disclosure.
Figure 6B:
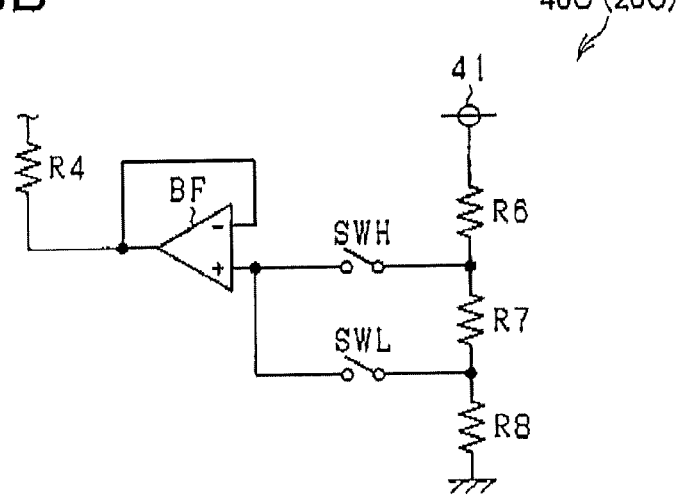
FIG. 6B is a circuit diagram schematically illustrating an example of the configuration of a reference voltage setter according to a modification of the third embodiment.

The following describes battery monitoring apparatuses 20B and 20C according to the third embodiment of the present disclosure with reference to FIGS. 6A and 6B while focusing on the different points between the third embodiment and the first embodiment.

A reference voltage setter 40B of the battery monitoring apparatus 20B according to the third embodiment is configured to enable the switches SWH and SWL to be simultaneously on.

FIG. 6A schematically illustrates an example of the structure of the reference voltage setter 40B. Referring to FIG. 6A, the reference voltage setter 40B further includes a known voltage follower BF provided between the second end of the resistor R4 and each of the switches SWH and SWL.

The voltage follower BF has an inverting input terminal connected to an output terminal of the voltage follower BF; the output terminal is connected to the second end of the resistor R4.

The voltage follower BF also has a non-inverting input terminal connected to a first end of each of the switches SWH and SWL.

A second end of the switch SWH opposite to the first end is connected to the first power source 41 via a resistor Ra, and also connected to a common ground of the reference voltage setter 40B via a resistor Rb. Similarly, a second end of the switch SWL opposite to the first end is connected to the second power source 42 via a resistor Rc, and also connected to the common ground of the reference voltage setter 40B via a resistor Rd.

The voltage follower BF outputs a voltage that follows an input voltage thereto while converting the input impedance into the output impedance lower than the input impedance.

Even if both the switches SWH and SWL are simultaneously turned on, a voltage, whose level is adjusted to be equal to or lower than the input voltage Vref based on the resistances of the resistors Ra to Rd, is input to the non-inverting input terminal of the voltage follower BF. The voltage follower BF outputs, to the operational amplifier 31a via the resistor R4, the input voltage as it is while changing the output impedance to be lower than the input impedance. This configuration of the reference voltage setter 40B therefore maintains the reference voltage applied to the operational amplifier 31a to be lower than the input voltage Vref of the microcomputer 32, thus limiting the level of a current flowing into the differential amplifier 31. The structure of the reference voltage setter 40B therefore enables monitoring of the voltage across any unit battery while eliminating the dead time between the switches SWH and SWL.

A reference voltage setter 40C of the battery monitoring apparatus 20C according to a modification of the third embodiment is configured to enable the switches SWH and SWL to be simultaneously on.

In particular, the voltage follower BF reduces the impedance of the reference voltage signal output from the voltage follower BF as compared with the impedance of the reference voltage signal input to the voltage follower BF. This prevents adverse effects due to the high impedance of the reference voltage signal input to the voltage follower BF on the differential amplifier 31.

FIG. 6B schematically illustrates an example of the structure of the reference voltage setter 40C. Referring to FIG. 6B, the reference voltage setter 40C includes a common power source 41, resistors R6 to R8, switches SWH and SWL, and a voltage follower BF.

The resistors R6 to R8 are connected in series in this order. A first end of the series-connected resistors R6 to R8, which is an end of the resistor R6, is connected to the common power source 41, and a second end of the series-connected resistors R6 to R8, which is opposite to the first end, is connected to a common ground of the reference voltage setter 40C.

The output terminal of the voltage follower BF is connected to the second end of the resistor R4, and the non-inverting input terminal of the voltage follower BF is connected to a first end of each of the switches SWH and SWL. A second end of the switch SWH opposite to the first end is connected to a connection point between the resistors R6 and R7. Similarly, a second end of the switch SWL opposite to the first end is connected to a connection point between the resistors R7 and R8.

The voltage follower BF, the resistors Ra to Rd, and the resistors R6 to R8 serve as, for example, a limiter.

This configuration of the reference voltage setter 40C enables an output voltage of the common power source 41, which is within the range from the half of the input voltage Vref to the input voltage Vref, to be divided by the resistances of the resistors R6, R7, and R8 into a first divided voltage for the switch SWH. The first divided voltage for the switch SWH is input to the non-inverting input terminal of the voltage follower BF upon the switch SWH being closed. In addition, this configuration of the reference voltage setter 40C enables the output voltage of the common power source 41 to be divided by the resistances of the resistors R6, R7, and R8 into a second divided voltage for the switch SWL. The second divided voltage for the switch SWL is input to the non-inverting input terminal of the voltage follower BF upon the switch SWL being closed. The first divided voltage for the switch SWH is higher than the second divided voltage for the switch SWL, and the reference voltage setter 40C makes it possible to change the reference voltage to be applied to the differential amplifier 31 according to the polarity of the voltage across the capacitor C.

In addition, even if both the switches SWH and SWL are simultaneously turned on, a voltage, whose level is adjusted to be equal to or lower than the input voltage Vref based on the resistances of the resistors R6 to R8, is input to the non-inverting input terminal of the voltage follower BF. The voltage follower BF outputs, to the operational amplifier 31a via the resistor R4, the input voltage as it is while converting the output impedance is lower than the input impedance. This configuration of the reference voltage setter 40C therefore maintains the reference voltage applied to the operational amplifier 31a to be lower than the input voltage Vref of the microcomputer 32, thus limiting the level of a current flowing into the differential amplifier 31. The structure of the reference voltage setter 40C therefore enables monitoring of the voltage across any unit battery while eliminating the dead time between the switches SWH and SWL.

In particular, the voltage follower BF reduces the impedance of the reference voltage signal output from the voltage follower BF as compared with the impedance of the reference voltage signal input to the voltage follower BF. This prevents adverse effects due to the high impedance of the reference voltage signal input to the voltage follower BF on the differential amplifier 31.

Fourth Embodiment

Figure 7:
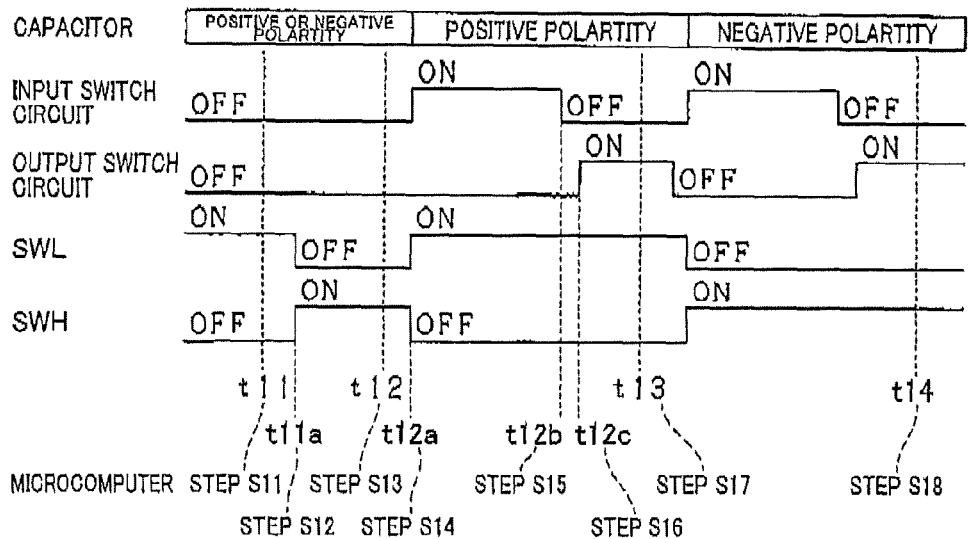
FIG. 7 is a timing chart schematically illustrating operations of a voltage monitoring apparatus according to the fourth embodiment of the present disclosure.

The following describes a battery monitoring apparatus according to the fourth embodiment of the present disclosure with reference to FIG. 7 while focusing on the different points between the fourth embodiment and the first embodiment.

The battery monitoring apparatus according to the fourth embodiment is configured to obtain an offset error voltage, i.e. a small deviation, measured by at least one of the differential amplifier 31 and the microcomputer 32 upon the differential amplifier 31 being unconnected to the output switch circuit 23. Then, the battery monitoring apparatus reduces the offset error voltage included in a voltage value measured by at least one of the differential amplifier 31 and the microcomputer 32.

Referring to FIG. 7, before time t11, the CPU 32c turns on the switch SWL while maintaining off the switches SW1 to SW9, SWA, SWB, and SWH. While the switch SWL is on and the other switches SW1 to SW9, SWA, SWB, and SWH are off, the A/D converter 32a converts the voltage converted by the differential amplifier 31 into a digital voltage value, and outputs the digital voltage value to the CPU 32c at time t11 in step S11. The CPU 32c stores the digital voltage value in the memory 32d as a first offset error voltage for the positive polarity at the time t11 in step S11.

Thereafter, the CPU 32c turns off the switch SWL, and turns on the switch SWH at time t11a in step S12.

While the switch SWH is on and the other switches SW1 to SW9, SWA, SWB, and SWL are off, the A/D converter 32a converts the voltage converted by the differential amplifier 31 into a digital voltage value, and outputs the digital voltage value to the CPU 32c at time t12 in step S13. The CPU 32c stores the digital voltage value in the memory 32d as a second offset error voltage for the negative polarity at the time t12 in step S13. For example, the operations in steps S11 and S13 serve as, for example, an offset error voltage obtainer.

Thereafter, the CPU 32c turns on a selected pair of switches SWi and SWi+1 (i=2, 4, 6, or 8) at time t12a, and turns off the switch SWH, and turns on the switch SWL at time t12a in step S14.

Thereafter, the CPU 32c turns off the switches SWi and SWi+1 at time t12b in step S15. After a predetermined short time has elapsed since the time t12b, the CPU 32c turns on the switches SWA and SWB at time t12c in step S16. This causes the voltage across the capacitor C to be input to the differential amplifier 31, so that the input voltage within the range from 0 to 30 V is converted into a voltage within the manipulated voltage range from 0 to 5 V.

When a predetermined A/D conversion timing t13 comes after a predetermined time has elapsed since the time t12c, the A/D converter 32a converts the voltage converted by the differential amplifier 31 into a digital voltage value, and outputs the digital voltage value to the CPU 32c in step S17.

At that time, the CPU 32c subtracts at least the first offset error voltage for the positive polarity from the digital voltage value output from the A/D converter 32a, thus calculating a digital voltage value as a voltage value across a selected unit battery Vi in step S17. Then, in step S17, the CPU 32c stores the digital voltage as a voltage value across the selected unit battery Vi in the memory 32d in step S17.

Similarly, when the voltage across the capacitor C with the negative polarity is input to the differential amplifier 31, so that the input voltage within the range from −30 to 0 V is converted into a voltage within the manipulated voltage range from −5 to 0 V, the A/D converter 32a converts the voltage converted by the differential amplifier 31 into a digital voltage value, and outputs the digital voltage value to the CPU 32c at time 14 in step S18.

At that time, the CPU 32c subtracts at least the second offset error voltage for the negative polarity from the digital voltage value output from the A/D converter 32a, thus calculating a digital voltage value as a voltage value across a selected unit battery in step S18. Then, in step S18, the CPU 32*c* stores the digital voltage as a voltage value across the selected unit battery in the memory 32*d* in step S18.

As described above, the battery monitoring apparatus according to the fourth embodiment is configured to obtain the first offset error voltage for the positive polarity included in a voltage value measured by at least one of the differential amplifier 31 and the microcomputer 32 upon no connection of the differential amplifier 31 to the output switch circuit 23 for the positive polarity. Then, the battery monitoring apparatus reduces the first offset error voltage included in a voltage value measured by at least one of the differential amplifier 31 and the microcomputer 32 upon connection of the differential amplifier 31 to the output switch circuit 23 for the positive polarity.

Similarly, the battery monitoring apparatus according to the fourth embodiment is configured to obtain the second offset error voltage for the negative polarity included in a voltage value measured by at least one of the differential amplifier 31 and the microcomputer 32 upon no connection of the differential amplifier 31 to the output switch circuit 23 for the negative polarity. Then, the battery monitoring apparatus reduces the second offset error voltage included in a voltage value measured by at least one of the differential amplifier 31 and the microcomputer 32 upon connection of the differential amplifier 31 to the output switch circuit 23 for the negative polarity.

This enables the digital voltage value across a selected unit battery to be measured while the measured digital voltage includes no first or second offset error voltage. This therefore improves the accuracy of monitoring the voltage across any unit battery in the battery pack 10.

Fifth Embodiment

Figure 8:
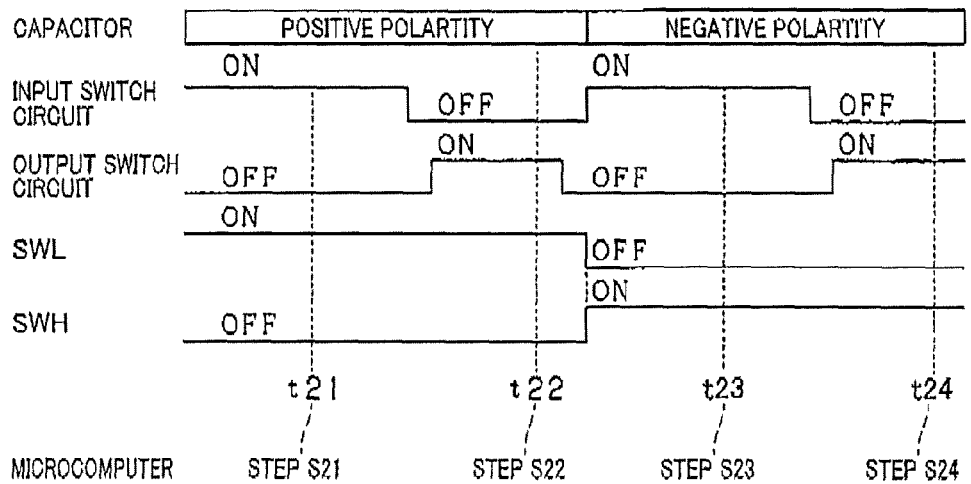
FIG. 8 is a timing chart schematically illustrating operations of a voltage monitoring apparatus according to the fifth embodiment of the present disclosure.

The following describes a battery monitoring apparatus according to the fifth embodiment of the present disclosure with reference to FIG. 8 while focusing on the different points between the fifth embodiment and the fourth embodiment.

The battery monitoring apparatus according to the fourth embodiment obtains each of the first and second offset error voltages, and thereafter, obtains a voltage value upon connection of the differential amplifier 31 to the output switch circuit 23 for a corresponding one of the negative and positive polarities.

In contrast, the battery monitoring apparatus according to the fifth embodiment obtains each of the first and second offset error voltages while charging a selected unit voltage into the capacitor C.

For example, while a selected pair of switches pair of switches SWi and SWi+1 (i=2, 4, 6, or 8) and the switch SWL are on and the other switches are off, the A/D converter 32*a* converts the voltage converted by the differential amplifier 31 into a digital voltage value while charging the voltage across the selected unit battery Vi into the capacitor C at time t21 in step S21. In step S21, the A/D converter 32*a* outputs the digital voltage value to the CPU 32*c* at time t21 in step S21. The CPU 32*c* stores the digital voltage value in the memory 32*d* as a first offset error voltage for the positive polarity at the time t21 in step S21.

Thereafter, while all the switches SW1 to SW9 and the switch SWH are off, and the switches SWA and SWB and the switch SWL are on, the A/D converter 32*a* converts the voltage converted by the differential amplifier 31 into a digital voltage value, and outputs the digital voltage value to the CPU 32*c* at time t22 in step S22.

At that time, the CPU 32*c* subtracts at least the first offset error voltage for the positive polarity from the digital voltage value output from the A/D converter 32*a*, thus calculating a digital voltage value as a voltage value across a selected unit battery Vi in step S22. Then, in step S22, the CPU 32*c* stores the digital voltage as a voltage value across the selected unit battery Vi in the memory 32*d* in step S22.

Similarly, while a selected pair of switches pair of switches SWi and SWi+1 (i=1, 3, 5, or 7) and the switch SWH are on and the other switches are off, the A/D converter 32*a* converts the voltage converted by the differential amplifier 31 into a digital voltage value while charging the voltage across the selected unit battery Vi into the capacitor C at time t23 in step S23. In step S23, the A/D converter 32*a* outputs the digital voltage value to the CPU 32*c* at time t23 in step S23. The CPU 32*c* stores the digital voltage value in the memory 32*d* as a second offset error voltage for the negative polarity at the time t23 in step S23.

Thereafter, while all the switches SW1 to SW9 and the switch SWL are off, and the switches SWA and SWB and the switch SWH are on, the A/D converter 32*a* converts the voltage converted by the differential amplifier 31 into a digital voltage value, and outputs the digital voltage value to the CPU 32*c* at time t24 in step S24.

At that time, the CPU 32*c* subtracts at least the second offset error voltage for the negative polarity from the digital voltage value output from the A/D converter 32*a*, thus calculating a digital voltage value as a voltage value across a selected unit battery Vi in step S24. Then, in step S24, the CPU 32*c* stores the digital voltage as a voltage value across the selected unit battery Vi in the memory 32*d* in step S24.

For example, the operations in steps S23 and S24 serve as, for example, an offset error voltage obtainer.

As described above, the battery monitoring apparatus according to the fifth embodiment obtains one of the first and second offset error voltages for a corresponding one of the positive and negative polarities while charging a selected unit voltage for a corresponding one of the positive and negative polarities into the capacitor C. This configuration more effectively measures a selected unit voltage while eliminating a corresponding offset error voltage from the selected unit voltage.

Sixth Embodiment

Figure 9:
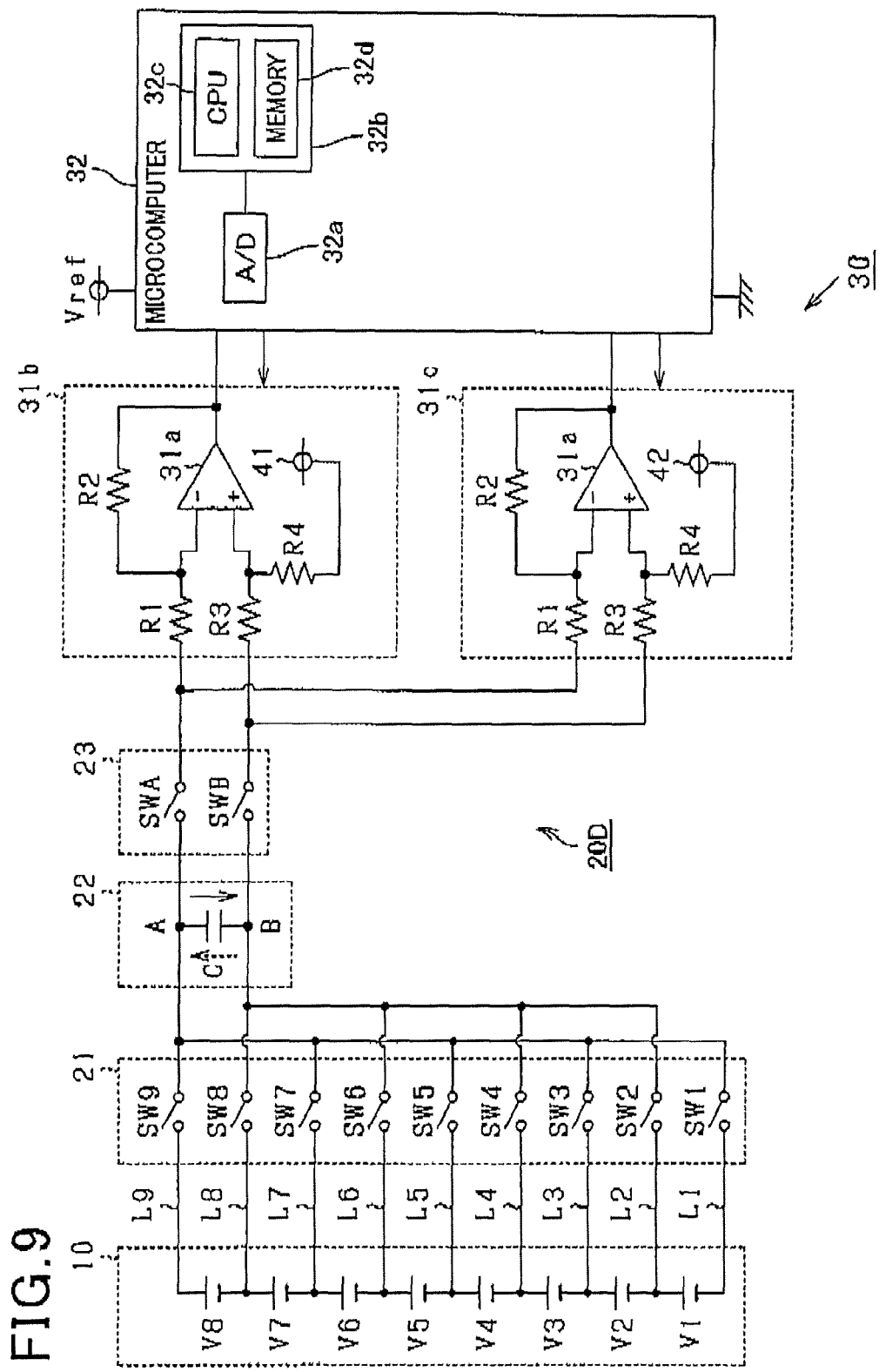
FIG. 9 is a circuit diagram schematically illustrating an example of the configuration of a battery monitoring system according to the sixth embodiment of the present disclosure.

The following describes a battery monitoring apparatus 20D according to the sixth embodiment of the present disclosure with reference to FIG. 9 while focusing on the different points between the sixth embodiment and the first embodiment.

As compared with the structure of the battery monitoring apparatus 20, the reference voltage setter 40 is eliminated from the battery monitoring apparatus 20D. The battery monitoring apparatus 20D includes (1) A first differential amplifier 31*b* connected to the respective switches SWA and SWB like the differential amplifier 31

(2) A second differential amplifier 31*c* connected to the respective switches SWA and SWB like the differential amplifier 31.

Each of the first and second amplifies 31*b* and 31*c* has a structure substantially identical to the structure of the differential amplifier 31.

In particular, the first differential amplifier 31*b* includes the first power source 41 connected to the second end of the resistor R4, and the second differential amplifier 31*c* includes the second power source 42 connected to the second end of the resistor R4.

In place of selectively turning on one of the switches SWH and SWL, the microcomputer 32, i.e. the CPU 32c, is configured to selectively activate one of the first and second differential amplifiers 31b and 31c according to the polarity of the voltage across the capacitor C. Then, the A/C converter 32a converts an output voltage from each of the differential amplifiers 31b and 31c into a digital voltage value.

The configuration of the battery monitoring apparatus 20D achieves substantially the same effects as those achieved by the battery monitoring apparatus 20.

The present disclosure is not limited to the descriptions of each of the first to sixth embodiments, and the descriptions of each of the first to sixth embodiments can be widely modified within the scope of the present disclosure.

The battery monitoring apparatus according to each of the first to sixth embodiments includes the single capacitor C in the capacitor circuit 22, but the present disclosure is not limited thereto. Specifically, the battery monitoring apparatus according to each of the first to sixth embodiments can include a known double flying capacitor circuit 22 including double capacitors C.

The battery monitoring apparatus according to each of the first to sixth embodiments is configured such that the microcomputer 32 performs
(1) Operations to selectively switch connection and disconnection of each of the switches SW1 to SW9
(2) Operations to switch the reference voltage 40 between 0 V and 5V.

However, the present disclosure is not limited to the configuration.

Specifically, the battery monitoring apparatus according to each of the first to sixth embodiments can be configured to output an instruction to select one pair of switches SWi and SWi+1 for a target polarity in the input switch circuit 21; the instruction includes a logic to select one of 0 V and 5 V as the reference voltage corresponding to the target polarity.

While illustrative embodiments of the present disclosure have been described herein, the present disclosure is not limited to the embodiments described herein, but includes any and all embodiments having modifications, omissions, combinations (e.g., of aspects across various embodiments), adaptations and/or alternations as would be appreciated by those in the art based on the present disclosure. The limitations in the claims are to be interpreted broadly based on the language employed in the claims and not limited to examples described in the present specification or during the prosecution of the application, which examples are to be construed as non-exclusive.

What is claimed is:

1. An apparatus including a voltage monitor for monitoring a voltage across a selected unit battery in a battery pack comprising a plurality of unit batteries, the apparatus comprising:
   a capacitor connected to the plurality of unit batteries via respective connection lines;
   an input switch circuit configured to selectively connect a unit battery of the unit batteries to the capacitor, a first group of at least one of the unit batteries having a first polarity when being connected to the capacitor, and a second group of at least one of the unit batteries having a second polarity when being connected to the capacitor, the second polarity being opposite to the first polarity;
   a voltage converter configured to convert a voltage of the unit battery selectively connected to the capacitor into a value within a predetermined voltage range manipulatable by the voltage monitor; and
   a reference voltage setter configured to variably set a reference voltage according to one of the first polarity and the second polarity of the voltage of the unit battery selectively connected to the capacitor, the reference voltage being used as a reference to match a scale of the voltage of a unit cell selectively connected to the capacitor with the predetermined voltage range,
   wherein the first polarity is a positive polarity, and the second polarity is a negative polarity,
   wherein the reference voltage setter is configured to:
      set the reference voltage to a first voltage value upon the polarity of the voltage of the unit battery selectively connected to the capacitor being positive; and
      set the reference voltage to a second voltage value upon the polarity of the voltage of the unit battery selectively connected to the capacitor being negative,
   wherein the reference voltage setter comprises:
      a first power source configured to output the first voltage value;
      a first switch configured to selectively perform connection of the first power source to the voltage converter and disconnection of the first power source from the voltage converter;
      a second power source configured to output the second voltage value; and
      a second switch configured to selectively perform connection of the second power source to the voltage converter and disconnection of the second power source from the voltage converter, and
   wherein the apparatus further comprises:
      a controller configured to:
      turn on the first switch to connect the first power source to the voltage converter upon the positive polarity of the voltage of the unit battery selectively connected to the capacitor; and
      turn on the second switch to connect the second power source to the voltage converter upon the negative polarity of the voltage of the unit battery selectively connected to the capacitor.

2. The apparatus according to claim 1, further comprising:
   an output switch circuit configured to selectively perform connection of the capacitor to the voltage converter and disconnection of the capacitor from the voltage converter,
   wherein the reference voltage setter is configured to variably set a value of the reference voltage according to one of the first polarity and the second polarity of the voltage of the unit battery selectively connected to the capacitor before the capacitor is connected to the voltage converter by the output switch unit.

3. The apparatus according to claim 1, wherein the reference voltage setter further comprises:
   a voltage setter configured to set the reference voltage to a third voltage value within the predetermined voltage range upon both the first and second switches being off.

4. The apparatus according to claim 3, wherein the reference voltage setter further comprises:
   a limiter configured to limit a current flowing to the voltage converter upon both the first and second switches being on.

5. The apparatus according to claim 4, wherein:
the voltage converter comprises an amplifier having an inverting input terminal and a non-inverting input terminal connected to the capacitor,
the amplifier being configured to obtain the voltage across the unit battery selectively connected to the capacitor according to a difference between a first input voltage at the inverting input terminal and a second input voltage at the non-inverting input terminal,
the reference voltage setter being configured to input one of the first voltage value and the second voltage value to the non-inverting input terminal.

6. The apparatus according to claim 5, further comprising:
an offset error voltage obtainer configured to obtain an offset error voltage measured by at least one of the voltage converter and the voltage monitor upon the capacitor being disconnected from the voltage converter,
wherein the voltage monitor is configured to subtract the offset error voltage from a voltage charged across the capacitor to which the unit battery is selectively connected, thus obtaining the voltage across the unit battery selectively connected to the capacitor.

7. The apparatus according to claim 6, wherein the offset error voltage obtainer is configured to obtain the offset error voltage before execution of obtaining the voltage across the unit battery selectively connected to the capacitor.

8. The apparatus according to claim 6, wherein the offset error voltage obtainer is configured to obtain the offset error voltage upon the unit battery being selectively connected to the capacitor.

9. The apparatus according to claim 1, wherein the voltage converter comprises an operational amplifier having an inverting input terminal and a non-inverting input terminal connected to the capacitor.

10. The apparatus according to claim 9, wherein the operational amplifier is configured to obtain the voltage across the unit battery selectively connected to the capacitor according to a difference between a first input voltage at the inverting input terminal and a second input voltage at the non-inverting input terminal,
the reference voltage setter being configured to input, to the non-inverting input terminal of the operational amplifier, a value of the reference voltage set thereby according to one of the first polarity and the second polarity of the voltage of the unit battery selectively connected to the capacitor.

* * * * *